(12) United States Patent
Zhou et al.

(10) Patent No.: US 7,606,030 B2
(45) Date of Patent: Oct. 20, 2009

(54) HEAT DISSIPATION DEVICE

(75) Inventors: Shi-Wen Zhou, Shenzhen (CN); Chun-Chi Chen, Taipei Hsien (TW); Guo Chen, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/955,308

(22) Filed: Dec. 12, 2007

(65) Prior Publication Data

US 2009/0154102 A1 Jun. 18, 2009

(51) Int. Cl.
*H05K 7/20* (2006.01)
*F28F 7/00* (2006.01)
*H01L 23/34* (2006.01)

(52) U.S. Cl. .................. 361/700; 165/104.33; 257/719
(58) Field of Classification Search ............ 165/104.33; 361/687, 700, 719–720; 257/718–719
See application file for complete search history.

(56) References Cited

U.S. PATENT DOCUMENTS

| | | | | |
|---|---|---|---|---|
| 3,851,221 A | * | 11/1974 | Beaulieu et al. ............. | 361/684 |
| 6,104,611 A | * | 8/2000 | Glover et al. ............... | 361/700 |
| 7,130,193 B2 | * | 10/2006 | Hirafuji et al. .............. | 361/700 |
| 7,142,422 B2 | * | 11/2006 | Lee et al. ..................... | 361/695 |
| 7,265,981 B2 | * | 9/2007 | Lee ............................. | 361/707 |
| 7,342,795 B2 | * | 3/2008 | Lee et al. ..................... | 361/719 |
| 2006/0126309 A1 | * | 6/2006 | Bolle et al. .................. | 361/719 |
| 2006/0262506 A1 | * | 11/2006 | Lee et al. ..................... | 361/703 |
| 2007/0086170 A1 | * | 4/2007 | Liang .......................... | 361/719 |
| 2007/0263355 A1 | * | 11/2007 | Yu et al. ...................... | 361/700 |

* cited by examiner

*Primary Examiner*—Gregory D Thompson
(74) *Attorney, Agent, or Firm*—Frank R. Niranjan

(57) ABSTRACT

A heat dissipation device includes a spreader, a heat sink comprising a base plate and a plurality of outer fins extending upwardly from a top surface of the base plate, a heat pipe thermally connecting the heat sink and the spreader together, a plurality of fasteners each including a fixture having a head at a top thereof, a spring encircling the fixture and a gasket wired on the fixtures. The fixtures extend through the base plate of the heat sink and the spreader, the gaskets are respectively compressed between the heads and the base plate, edge of the base plate of the heat sink is joined with the housing of the computer, and cooperates with the housing to form a hermetic encapsulation which encloses the heat-generating electronic component.

16 Claims, 5 Drawing Sheets

HEAT DISSIPATION DEVICE

BACKGROUND OF THE INVENTION

1. Field of the Invention

The present invention relates generally to a heat dissipation device, and more particularly to a heat dissipation device for removing heat from a CPU in a high hermetic encapsulation.

2. Description of Related Art

Electronic component includes numerous circuits operating at high speed and generating substantive heat in a computer. In many applications, it is desirable to employ a heat sink to remove heat from the heat-generating electronic components, such as central processing units (CPUs) etc., to assure that the components function properly and reliably. A typical heat sink comprises a base for contacting with the heat-generating electronic component to absorb the heat generated by the heat-generating electronic component and a plurality of parallel planar fins thermally connected to the base directly or by heat pipes. Alternatively, the fins can be integrally formed with the base by metal extrusion, such as aluminum extrusion. The fins are used for dissipating the heat from the base to ambient air.

In traditional application, the heat sink is either encapsulated in a hermetic enclosure or outside of the enclosure of the computer. However, in some abominable circumstance such as sandy field, the CPU and other elements should be highly encapsulated in the enclosure of the computer so as to be protected from sand and dust in ambient. If the heat sink is mounted in the hermetic enclosure, the heat sink would be very poor in heat dissipating efficiency and can not dissipate heat into ambient in such an encapsulated space. If the heat sink is exposed to ambient, it is hard to achieve the hermetic encapsulation for some gaps or orifices provided on the enclosure or in the heat sink to mount the heat sink in the enclosure and thermally connect the heat sink to the CPU via heat pipes.

What is needed is a heat dissipation device with an improved structure and overcome abovementioned disadvantages.

SUMMARY OF THE INVENTION

A heat dissipation device for removing heat from a heat-generating electronic component mounted on a printed circuit board enclosed in housing, includes a spreader for contacting with a heat-generating electronic component, a heat sink comprising a base plate and a plurality of outer fins extending upwardly from a top surface of the base plate, a heat pipe thermally connecting the heat sink and the spreader together, a plurality of fasteners each including a fixture having a head at a top thereof, a spring encircling the fixture and a gasket mounted around fixture. The fixtures extend through the base plate of the heat sink and the spreader, the gaskets are respectively compressed between the heads and the base plate, an edge of the base plate of the heat sink is joined with the housing of the computer, and cooperates with the housing to form a hermetic encapsulation which encloses the heat-generating electronic component.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION OF THE INVENTION

Figure 1:
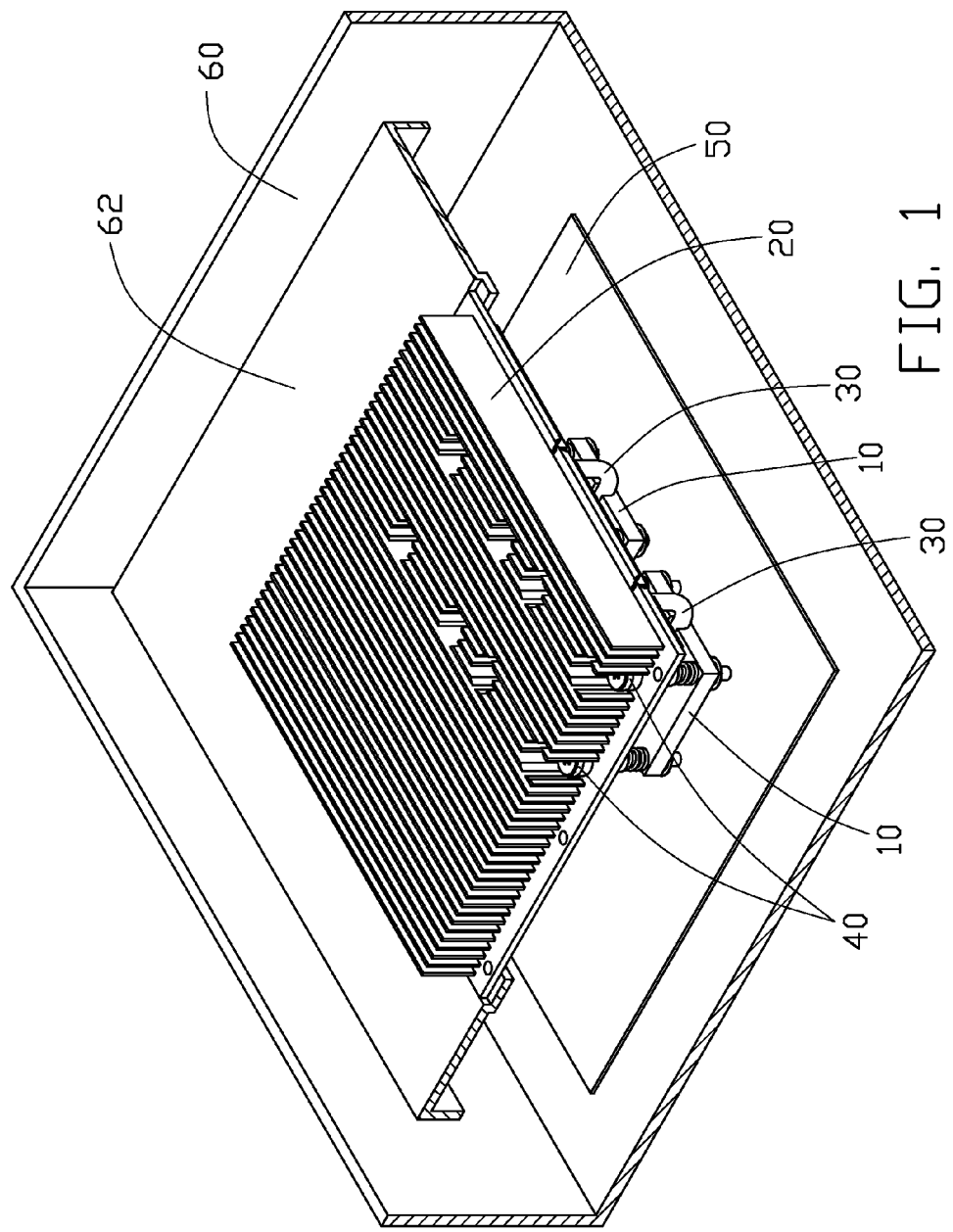
FIG. 1 is an assembled view of a heat dissipation device enclosed in a housing in accordance with a preferred embodiment of the present invention.
Figure 2:
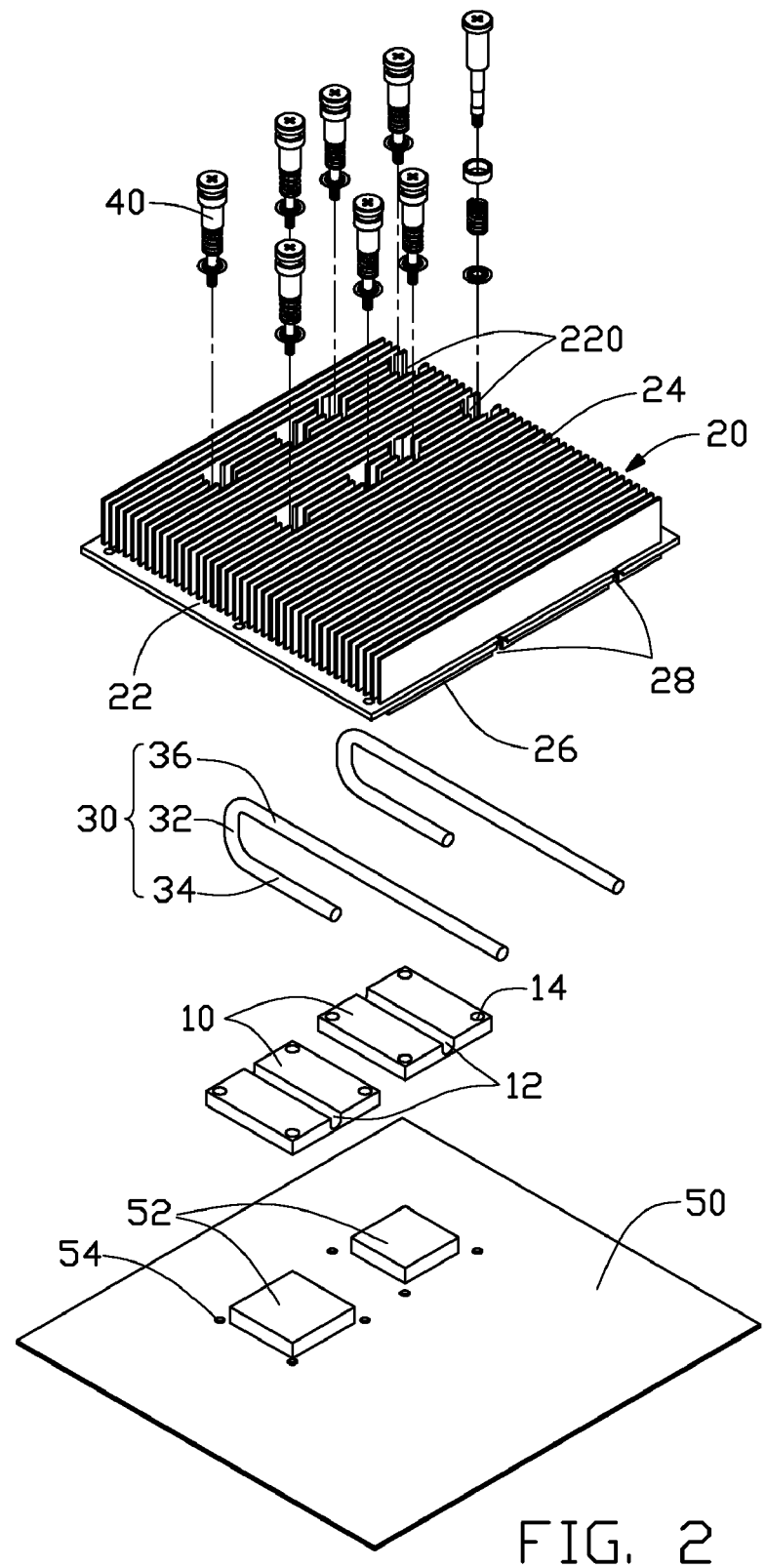
FIG. 2 is an exploded, isometric view of the heat dissipation device of FIG. 1.

Referring to FIGS. 1-2, a heat dissipation device in accordance with a preferred embodiment of the present invention is shown. The heat dissipation device is adapted for removing heat from two heat-generating sources such as CPUs 52 mounted on a printed circuit board 50 enclosed in a hermetic housing 60 of a computer. The heat dissipation device comprises two conductive spreaders 10 in intimately contact with the two CPUs 52, a heat sink 20 combined with receiving panels 62 of the housing 60 to encapsulate the printed circuit board 52, two heat pipes 30 thermally connecting the two spreaders 10 and the heat sink 20 together, and a plurality of fasteners 40 simultaneously securing the spreaders 10 and heat sink 20.

The printed circuit board 50 has two spaced CPUs 52 mounted thereon and a plurality of engaging orifices 54 surrounding each of the CPUs 52 for providing passage of the fasteners 40 to mount the heat dissipation device thereon.

The conductive spreaders 10 are made of metallic material with high conductivity such as copper. Each of the spreaders 10 has a rectangular plate-shaped configuration, and has a bottom surface contacting with one of the CPUs 52 and defines a straight receiving groove 12 at a top surface thereof. The receiving groove 12 is located at a middle of the top surface and parallel to two opposite lateral sides of the spreader 10 for receiving portion of the heat pipe 30. Four fixing holes 14 are corresponding to the engaging orifices 54 of the printed circuit board 50 and defined in four corners of each of the spreaders 10 for receiving the fasteners 40.

The heat sink 20 is integrally formed from a material with good heat conductivity such as aluminum, copper by die casting. The heat sink 20 comprises a base plate 22, a plurality of first fins 24 extending upwardly from a top surface of the base plate 22 and a plurality of second fins 26 extending downwardly from a bottom surface of the base plate 22. The base plate 22 should not be restricted in a certain shape, it is preferred to be rectangular in this embodiment. The base plate 22 defines eight through holes 220 in predetermined places thereof and corresponding to the fixing holes 14 of the spreaders 10 for receiving the fasteners 40. The first fins 24 and the second fins 26 are perpendicular to the base plate 22 and parallel to two lateral sides of the base plate 22. The first fins 24 extend upwardly from a top surface of the base plate 22. The second fins 26 extend downwardly from a bottom surface of the base plate 22. The first fins 24 are much higher than the second fins 26 (, heat delivered from the CPUs 52 thus is mainly dissipated into ambient by the first fins 24 that are exposed outside of the receiving panels 62 of the housing 60. The second fins 26 and the base plate 22 cooperatively define two spaced receiving channels 28 perpendicular to the fins 24, 26 for receiving portion of the heat pipes 30.

The heat pipes 20 each comprise a connecting section 32, an evaporating section 34 extending perpendicularly from an end of the connecting section 32, and a condensing section 36 extending from another end of the connecting section 32 and parallel to the evaporating section 34. The two evaporating sections 34 are respectively received in the two receiving grooves 12 of the two base plates 10 and much shorter than the condensing sections 36 that are received in two receiving channels 28 of the heat sink 20. Each of the evaporating sections 34 has a substantially same length as that of the conductive spreaders 10 along an axial direction of the heat pipes 30. Each of the condensing sections 36 has a substantially same length as that of the base plate 22 along the axial direction of the heat pipes 30.

Figure 3:
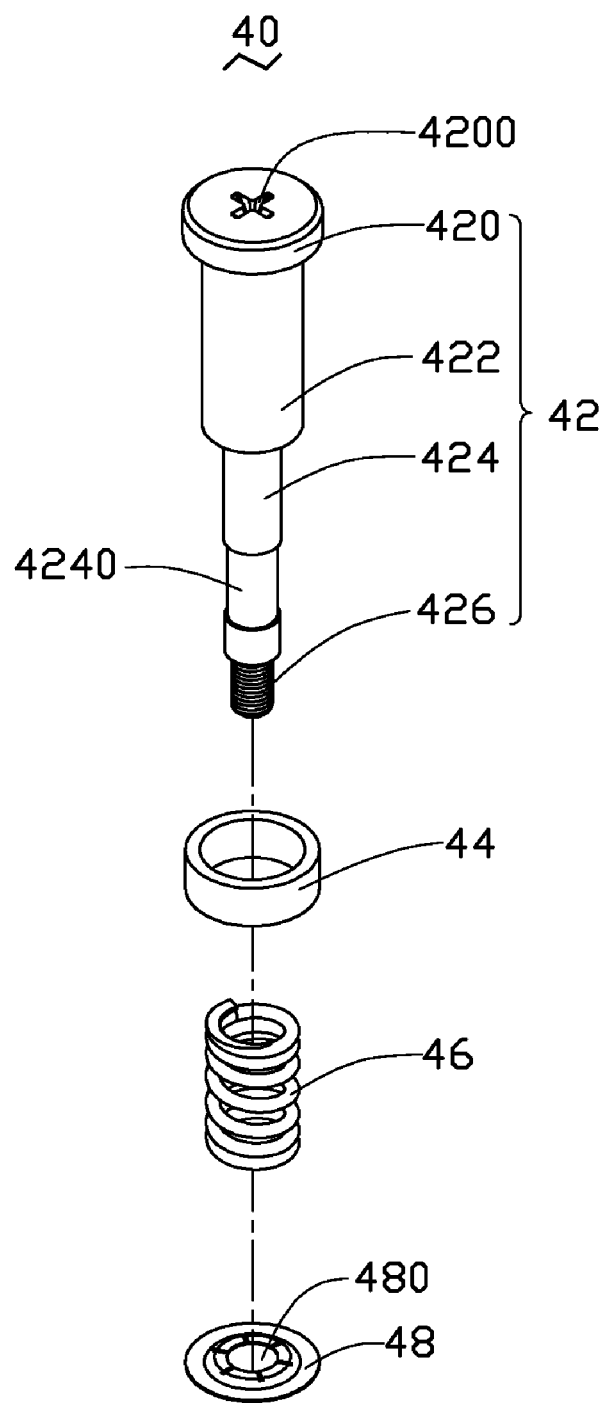
FIG. 3 is an exploded, enlarged view of a fastener of the heat dissipation device of FIG. 2.

As shown in FIG. 3, each of the fasteners 40 includes a pole-shaped fixture 42, a gasket 44 mounted around the fixture 42, a helical spring 46 encircling the fixture 42 and a securing piece 48 for securing the fastener 40 to the spreaders 10 and the heat sink 20. The fixture 42 has a circular head 420 at a top thereof a column 422 extending downwardly from the head 420, a shaft 424 extending downwardly from a bottom end of the column 422 and an engaging portion 426 connected to the shaft 424 at a bottom end thereof. The head 420 at a top thereof defines a cross-shaped slot 4200 therein for positioning a tool (not shown), such as a screwdriver. A diameter of the column 422 is smaller than that of the head 4200 and bigger than that of the shaft 424. The shaft 424 defines an annular recess 4240 adjacent to the engaging portion 426. The engaging portion 426 has a diameter slightly smaller that of the shaft 424 and has threads formed thereon for screwing into the corresponding engaging orifice 54 of the printed circuit board 50.

The gasket 44 is made of soft material such bubble cotton for filling a gap between the fixtures 42 and the base plate 22 of the heat sink 20, snugly encircling the column 422 and blocked beneath the head 420. The spring 46 has an inner diameter smaller than that of the column 422 and bigger than that of the shaft 424 in a manner such that the spring 46 is dimensioned to snugly fit around the shaft 424 and a top of the spring 46 abuts against a bottom of the column 422. The securing piece 48 defines a locking aperture 480 in a center thereof and a plurality of radial slots (not labeled) around and communicating with the aperture 480 for enhancing flexibility of the securing piece 48 to facilitate the securing piece 48 to be combined to the groove annular recession 4240 of the shaft 424.

Figure 4:
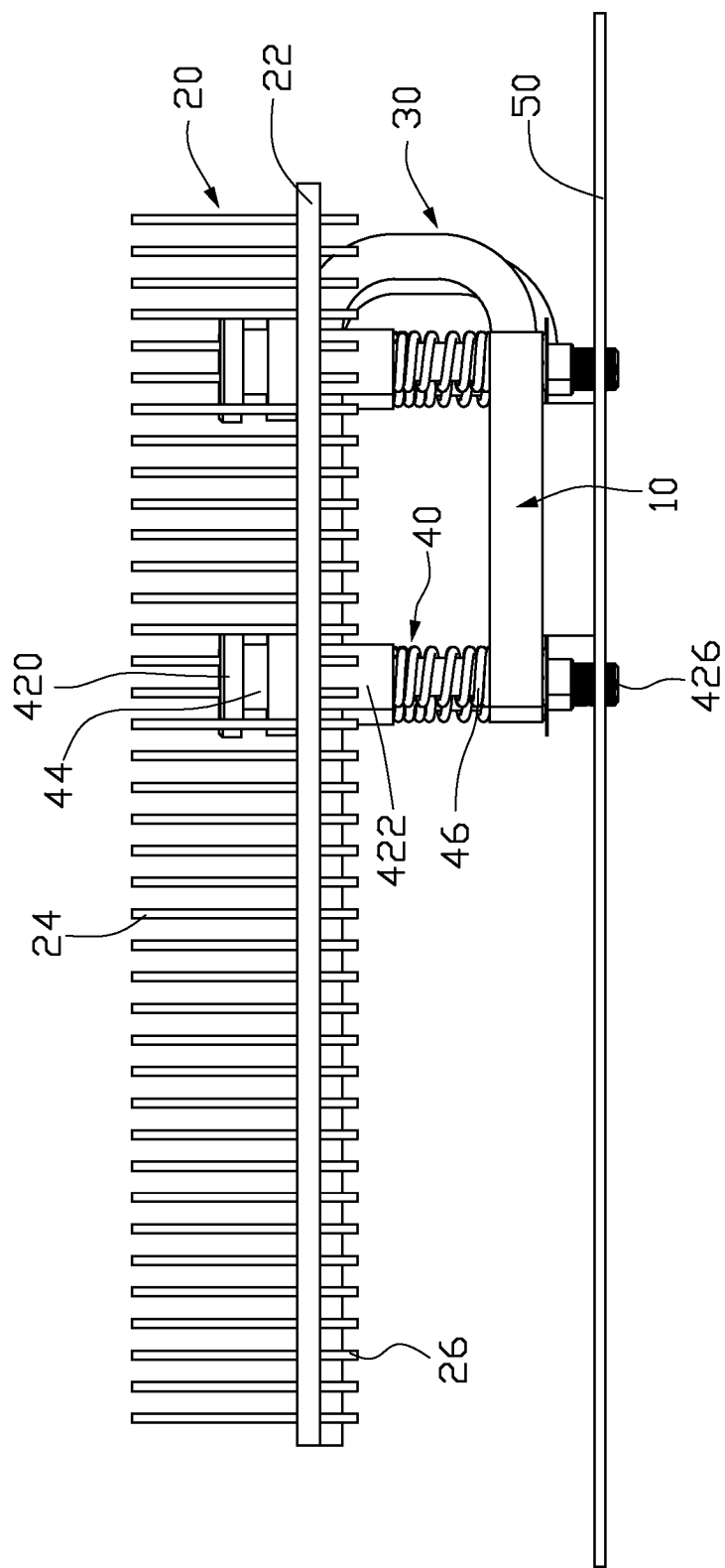
FIG. 4 is a side elevation of the heat dissipation device of FIG. 1 with fixtures un-completely screw into the printed circuit board.

As shown in FIG. 2 and FIG. 4, in assembly of the heat dissipation device, the two evaporating sections 34 of the two heat pipes 30 are received and secured in the two receiving grooves 13 of two respective spreaders 10 by means of soldering or adhering. The two condensing sections 36 of the two heat pipes 30 are received and secured in the two receiving channels 28 of the heat sink 20 by means of soldering or adhering. The eight fixtures 42 of the fasteners 40 with the gaskets 44 and the spring 46 mounted thereon are respectively extended through the eight through holes 220 of the heat sink 20 and the eight fixing holes 14 of the two spreaders 10 in sequence. Due to the inner diameter of the springs 46 being larger than that of the fixing holes 14, the springs 46 contact the spreaders 10, for exerting spring force downwardly on the spreaders 10 when the fasteners 40 are threadedly fastened to a retainer (not shown) below the printed circuit board 50. The engaging portion 426 and the lower portion of the shaft 424 are inserted onto the locking aperture 480 of the securing piece 40 beneath the spreader 10 and force fringe portions of the locking apertures 480 of the securing pieces 48 to deform. After the engaging portions 426 and the lower portion of the shafts 424 pass through the locking apertures 480 of the securing pieces 48 and the annular recession 4240 of the shaft 424 reaches the position below the spreaders 10, the securing pieces 48 restore from the deformation and snap in the recesses 4240 of the shaft 424 the securing pieces 48, the heat dissipation device is thus securely pre-assembled as shown in FIG. 4. Simultaneously, the gaskets 44 encircling the corresponding columns 422 are loosely sandwiched and restricted between the heads 420 of the fixtures 42 and the base plate 22 of the heat sink 20, the springs 46 are respectively compressed between the bottoms of the columns 422 and the tops of the spreaders 10.

Figure 5:
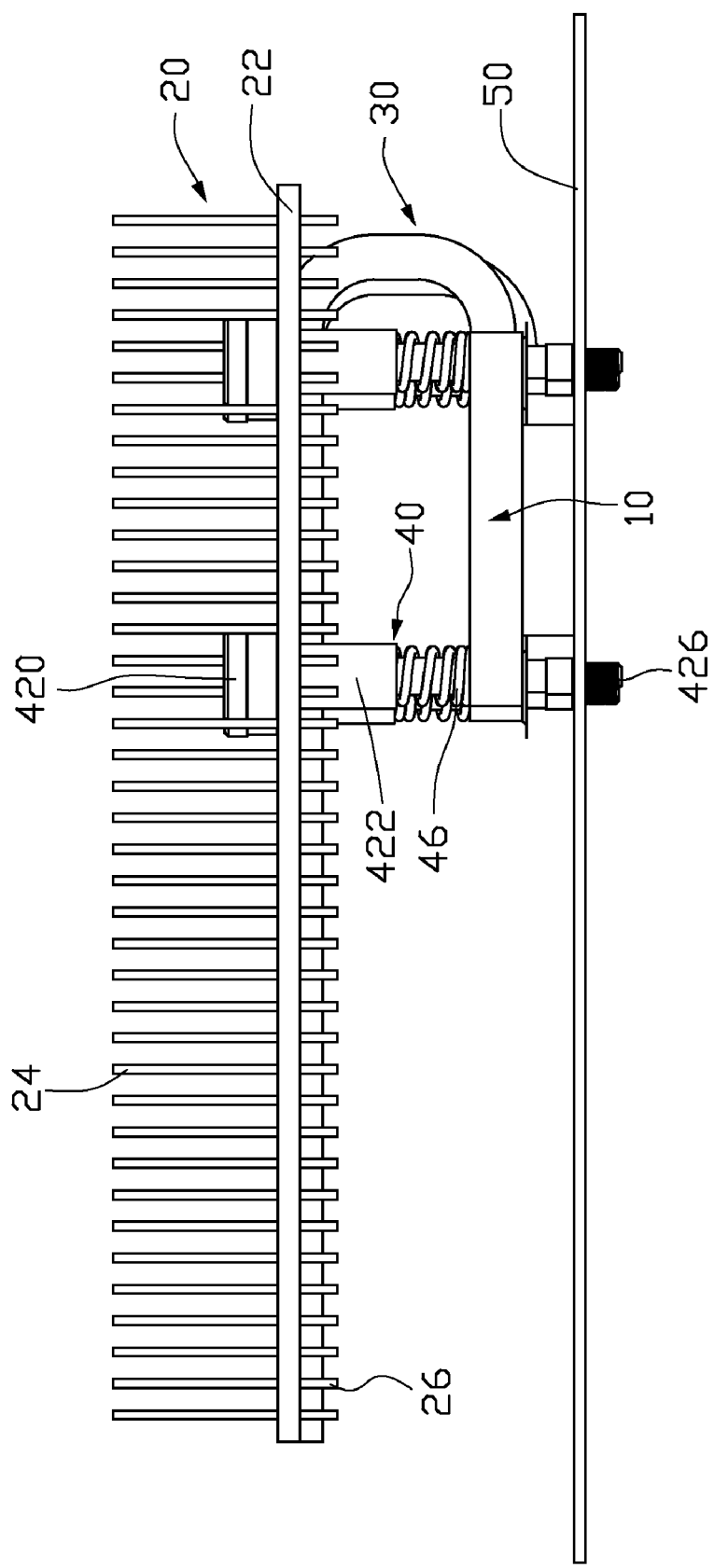
FIG. 5 is a side elevation of the heat dissipation device of FIG. 4 with the fixtures completely screw into the printed circuit board.

Also referring to the FIG. 5, in use of the heat dissipation device, the two spreaders 10 are placed on the two respective CPUs 52 and the engaging portions 426 of the fixtures 42 are respectively in aligned with the engaging orifices 54 in the printed circuit board 50. Edge of the base plate 22 of the heat sink 20 is joined with the receiving panels 62 of the housing 60 of the computer, and cooperates with the housing 60 to form a hermetic encapsulation which encloses the CPUs 52 and other elements therein. The engaging portions 426 are then driven by the screw driver placed in the cross-shaped slots 4200 of the fixtures 42 to screw downwardly into the corresponding engaging orifices 54. Simultaneously, the springs 46 between the spreaders 10 and the columns 424 of the fixtures 42 are further compressed and press the spreaders 10 downwardly toward the CPUs 52. The gaskets 44 are pressed downwardly by the heads 420 of the fixtures 42 and compressed between the heads 420 and base plate 22, thereby gaps between the through holes 220 of the heat sink 20 and the columns 424 of the fixtures 42 in the through holes 220 are totally sealed by the bubble cotton gaskets 44. Heat generated by the CPUs 52 is delivered to the heat sink 20 via the heat pipes 30 and dissipated into ambient by the first fins 24 of the heat sink 20 outside the encapsulation formed by the housing and base plate 22 of the heat sink 20. When the computer equipped with the heat dissipation device is used in sandy environment, heat produced inside the computer can be dissipated into ambient outside the computer and the computer also can be well protected from dust and sand everywhere in ambient.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention

What is claimed is:

1. A heat dissipation device for removing heat from a heat-generating electronic component mounted on a printed circuit board enclosed in a computer housing, comprising:
    a spreader adapted for contacting with the heat-generating electronic component;
    a heat sink comprising a base plate and a plurality of outer fins extending upwardly from a top surface of the base plate;
    a heat pipe thermally connecting the heat sink and the spreader together; and
    a plurality of fasteners each comprising a fixture having a head at a top thereof, a spring encircling the fixture and a gasket mounted around the fixture between the spring and the head;

wherein the fixtures extend through the base plate of the heat sink and the spreader and each have a lower end being screwed downwardly into the printed circuit board, the gaskets are respectively compressed between the heads and the base plate, an edge of the base plate of the heat sink is joined with the computer housing, and cooperates with the computer housing to form a hermetic encapsulation which encloses the heat-generating electronic component.

2. The heat dissipation device of claim 1, wherein the base plate has inner fins extending downwardly from a bottom surface thereof.

3. The heat dissipation device of claim 2, wherein the outer fins are much higher than the inner fins.

4. The heat dissipation device of claim 3, wherein the inner fins and the base plate cooperatively define a channel perpendicular to the outer and inner fins for receiving a corresponding portion of the heat pipe therein.

5. The heat dissipation device of claim 1, wherein each gasket is made of bubble cotton for filling a gap between the base plate and the head of a corresponding fixture.

6. The heat dissipation device of claim 1, wherein each fixture has a column having a diameter smaller than that of a corresponding head and extending downwardly from the corresponding head, a shaft connected to a bottom end of the column and having a diameter smaller than that of the column, and an engaging portion formed at a bottom end of the shaft.

7. The heat dissipation device of claim 6, wherein the base plate defines a plurality of through holes therein, the columns of the fixtures are respectively received in the through holes, gaps between the heads of the fixtures and the base plate are sealed by the gaskets.

8. The heat dissipation device of claim 6, wherein each spring encircles the shaft and is compressed between the bottom end of the column of a corresponding fixture and the spreader.

9. The heat dissipation device of claim 6, wherein the engaging portion of each fixture defines threads thereon and is screwed into the printed circuit board.

10. The heat dissipation device of claim 6, wherein the spreader defines four fixing holes at four corner thereof, the shafts of the fixtures are respectively received in the fixing holes.

11. The heat dissipation device of claim 6, wherein each of the fasteners further comprises a securing piece with a locking aperture in its centre, each shaft defines an annular recession adjacent to the engaging portion of a corresponding fixture, the securing piece locks with the annular recession in the locking aperture thereof and abut against a bottom surface of the spreader.

12. The heat dissipation device of claim 1, wherein the spreader defines a receiving groove therein for receiving a portion of the heat pipe.

13. The heat dissipation device of claim 1, wherein the heat pipe comprises an evaporating section coupled to the spreader in a thermally conducting relationship therewith, a condensing section attached to a bottom surface of the base plate in a thermally conductive relationship therewith and a connecting section connecting the evaporating section and the condensing section together.

14. The heat dissipation device of claim 13, wherein the spreader on a top surface thereof defines a receiving groove receiving the evaporating section, the evaporating section has a substantially same length as that of the spreader along an axial direction of the heat pipe, the condensing section is soldered to a bottom surface of the base plate and has a substantially same length as that of the base plate along the axial direction of the heat pipe.

15. A computer system, comprising:
    a computer enclosure having inner boards extending from inner sides thereof;
    a printed circuit board mounted in the computer enclosure and having an electronic component mounted thereon;
    a heat spreader mounted on the electronic component;
    a heat sink having a base plate parallel to spaced from the heat spreader, wherein the inner boards of the computer enclosure engage with the base plate of the heat sink to form a hermetic encapsulation to prevent dust from entering therein;
    a plurality of fasteners extending through the base plate and the heat spreader to engage with the printed circuit board and each having a shaft, an elastic sleeve mounted around the shaft, and a spring mounted around the shaft and located below the sleeve, the sleeve mounted between a top of the shaft and the base plate, the spring compressed between the heat spreader and the base plate; and
    a heat pipe having an evaporating portion embedded in the heat spreader and a condensing portion embedded in the base plate of the heat sink.

16. The heat dissipation device of claim 15, wherein a plurality of fins distributes on top and bottom surfaces of the base plate of the heat sink.

* * * * *